United States Patent [19]

Matsumoto

[11] Patent Number: 4,914,492
[45] Date of Patent: Apr. 3, 1990

[54] INSULATED GATE FIELD EFFECT TRANSISTOR

[75] Inventor: Hiroshi Matsumoto, Tokyo, Japan

[73] Assignee: NEC Corporation, Japan

[21] Appl. No.: 257,851

[22] Filed: Oct. 14, 1988

[30] Foreign Application Priority Data

Oct. 16, 1987 [JP] Japan .................................. 62-260836

[51] Int. Cl.$^4$ ............................................ H01L 29/78
[52] U.S. Cl. .................................. 357/23.3; 357/23.8; 357/91; 357/23.1
[58] Field of Search ........................ 357/23.3, 23.8, 91, 357/23.1

[56] References Cited

U.S. PATENT DOCUMENTS 4,242,691 12/1980 Kotani .................................. 357/23.3

OTHER PUBLICATIONS

D. Hodges & M. Jackson, "Analysis & Design of Integrated Circuits", McGrawHill, New York, 1983, pp. 132-135.
S. SXE, "Physics of Semiconductor Devices", John Wiley and Sons, New York, 1981, p. 488.

Primary Examiner—Andrew J. James
Assistant Examiner—David Soltz
Attorney, Agent, or Firm—Laff, Whitesel, Conte & Saret

[57] ABSTRACT

An insulated gate field effect transistor, in which at least the drain region is surrounded by an impurity region of the same conductivity type as and a higher impurity concentration than the substrate, is disclosed. A portion of the impurity region under the drain region contains both of P-type and N-type impurities to form an abrupt profile therby depleting the portion with a depletion layer by the built-in potential.

3 Claims, 8 Drawing Sheets

INSULATED GATE FIELD EFFECT TRANSISTOR

BACKGROUND OF THE INVENTION

The present invention relates to an insulated gate field effect transistor (hereinafter abbreviated to IGFET).

To avoid an unfavorable lateral extension of a depletion layer from a drain region into a channel region when a drain voltage (drain bias) is applied, an impurity region having the same conductivity type as and a higher impurity concentration than the substrate is formed in the channel region between drain and source regions. The technology is described, for example, in U.S. Pat. No. 3,745,425. On the other hand, when the IGFET is of a type having a short channel (1 μm or less) thereby forming a shallow source, drain region, the impurity region having the higher impurity concentration and formed in the channel region is also formed inevitably under the bottom of the drain region deeply from the bottom. The IGFET can be prevented from a punch-trough phenomenon by the lateral extension of the depletion layer mentioned above because the impurity region of high impurity concentration is provided in the channel region, that is, in a portion of the substrate between the sides of the source and drain regions facing each other. However, at the bottom of the drain region, an extension of the depletion layer is also suppressed. Therefore, the output capacitance of the IGFET due to the PN junction at the bottom of drain region becomes a high level during the operation by applying the drain voltage so that the IGFET has its high-speed operation adversely affected.

SUMMARY OF THE INVENTION

Accordingly, it is an object of the present invention to provide an improved IGFET in which the depletion layer from the bottom of the drain region is largely extended inward the substrate to obtain a small drain capacitance, and the depletion layer from the side of the drain facing the source region is suppressed its extension to avoid the punch-through phenomenon.

According to a feature of the present invention, there is provided an IGFET which comprises; a semiconductor substrate of a first conductivity type having a major surface and an impurity concentration; a first impurity region of the first conductivity type having a first net impurity concentration obtained, in every part, by compensating first impurity atoms of the first conductivity type involved in the first impurity region with second impurity atoms of a second conductivity type opposite to the first conductivity type, involved in the first impurity region, a maximum value of the first net impurity concentration being higher than the impurity concentration of the substrate, and the first impurity region defined by the first net impurity concentration having an upper surface coinciding with the major surface and a bottom positioned at a first depth from the major surface; a second impurity region having a second net impurity concentration obtained, in every part, by compensating each other between first impurity atoms of the first conductivity type involved in the second impurity region and second impurity atoms of the second conductivity type involved in the second impurity region, a maximum value of the second net impurity concentration being lower than the maximum value of the first net impurity concentration of the first impurity region, and the second impurity region defined by the second net impurity concentration being formed in an inner section of the substrate abutted against the bottom of the first impurity region at the first depth; a channel region positioned in the major surface and composed of a surface portion of the first impurity region; a gate insulating film formed on the channel region; a gate electrode formed on the gate insulating film; and source and drain regions of the second conductivity type formed in the substrate and separated each other by interposing the channel region therebetween, at least the drain region having a third net impurity concentration obtained, in every part, by compensating second impurity atoms of the second conductivity type involved in the drain region with first impurity atoms of the first conductivity type involved in the drain region, a maximum value of the third net impurity concentration of the drain region being higher than the maximum value of the first net impurity concentration of the first impurity region, and the drain region defined by the third net impurity concentration having an upper surface coinciding with the major surface, a bottom contacted to a first portion of the first impurity region at a second depth from the major surface shallower than the first depth and side facing to the source region, the side being extended from the major surface to the edge of the bottom and contacted in full depth to a second portion of the first impurity region including the surface portion thereof; whereby, the first portion of the first impurity region under the bottom of the drain region is sufficiently narrow between the first and second depths such that the first portion is completely filled with a depletion layer extending from a PN junction between the bottom of the drain region and the first portion contacted to said bottom when the transistor including the drain region be free from a voltage.

The semiconductor substrate of one conductivity type may be a semiconductor body as a raw or start wafer per se. Or else, the semiconductor substrate of one conductivity may be a well of one conductivity type formed in a semiconductor body of the other conductivity type. The recitation of the degree of the net impurity concentration by its maximum value means that the part in the vicinity of its boundary or the PN junction is excluded. When the second impurity region by the second net impurity concentration is of the first conductivity type, the second net impurity concentration in every part of the second impurity region except in a part in the vicinity of the boundary between the second impurity region and the substrate may be higher than the impurity concentration of the substrate, and lower than the maximum value in the first net impurity concentration of first impurity region. In this case, the second net impurity concentration in every part of the second impurity region may be less than $10^{16}$ cm$^{-3}$, and the maximum value in the first net impurity concentration of the first portion of the first impurity region under the drain region may be more than $10^{17}$ cm$^{-3}$. On the other hand, when the second impurity region by the second net impurity concentration is of the second conductivity type and PN junctions are formed at the first depth by the first and second impurity regions and at the boundary between the second impurity region and the substrate, respectively, the maximum value of the third net impurity concentration may be $10^{19}$ cm$^{-3}$ or more, the maximum value of the first net impurity concentration may be $10^{17}$ cm$^{-3}$ or more, and the maximum value of the second net impurity region may be $10^{16}$ $cm^{-3}$ or less. If the depletion layer extends by the built-in potential by 0.1 μm in zero bias state, the effective width in the depthwise direction of the first portion of the first impurity region under the drain is designed to be less than 0.1 μm.

According to the present invention the first portion of the first impurity region is completely depleted by the depletion layer even when the zero bias state, that is, non-operation state, and therefore, when the voltage is applied to the drain region in the operation, the depletion layer is promptly, largely extended inward the substrate under the drain region thereby realizing a high speed operation of the IGFET with a small output capacitance. On the other hand, the first impurity region of high impurity concentration surrounds completely the drain region, at the bottom as well as at the side, and therefore, an unfavorable punch-through phenomenon between source and drain regions never be caused.

EXPLANATION OF A PRIOR ART

Figure 1A:
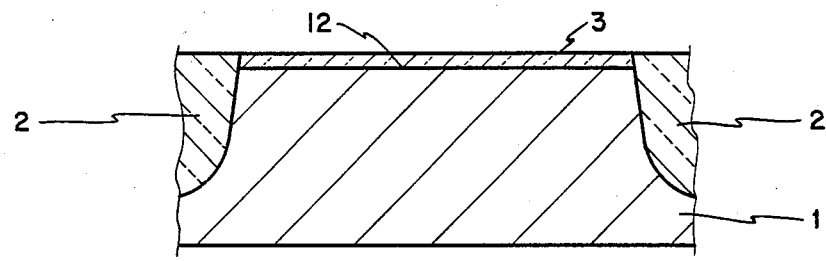
FIGS. 1A to 1D are cross-sectional views showing manufacturing process steps for forming an IGFET of a prior art.

Referring to FIGS. 1A to 1D, an IGFET of a prior art and a process for manufacturing the same will be explained. A field insulating silicon oxide layer 2 is selectively formed by a trench method from a surface of a P-type silicon substrate 1 containing boron atoms of $1 \times 10^{15}$ $cm^{-3}$ impurity concentration. Then, on a transistor forming region of the substrate 1 surrounded by the thick field silicon oxide layer 2 a silicon oxide film 3 of 8 nm thickness serving as a gate insulating film at its center portion is thermally formed. The surface of the transistor forming region attached to the silicon oxide film 3 is a major surface 12 of the substrate (FIG. 1A).

Figure 1B:
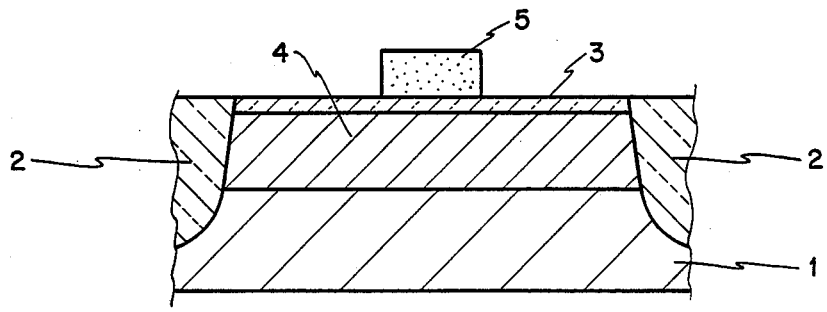
Figure 1C:
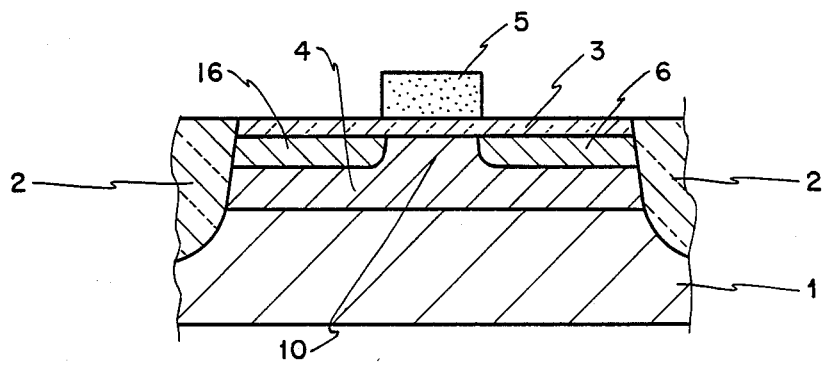
Figure 1D:
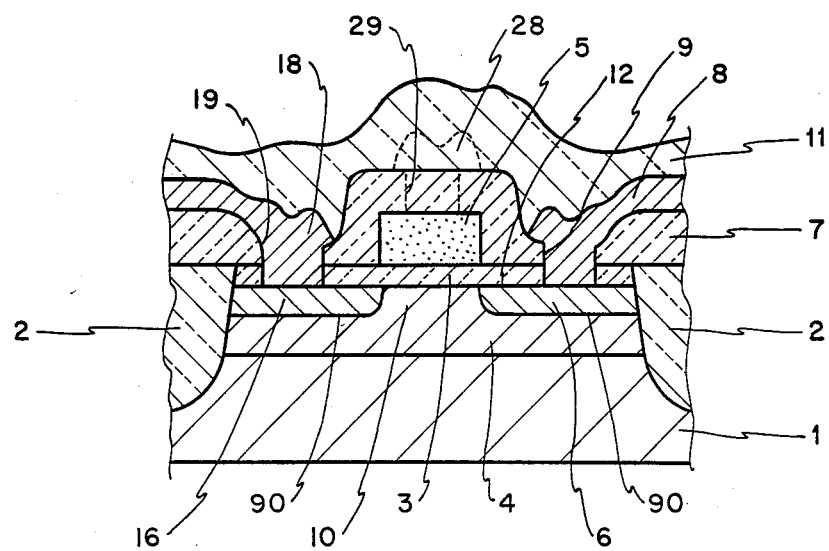

Next, boron atoms are injected by ion-implantation with an acceleration energy of 35 KeV and in a dosage of $3 \times 10^{12}$ $cm^{-2}$ to form a deep P-type region 4 of high impurity concentration. Further, in order to control the threshold voltage of the IGFET, the surface of the region 4 is subjected to a boron ion implantation with an acceleration energy of 10 KeV and in a dosage of $1 \times 10^{12}$ $cm^{-2}$. Then, a gate electrode 5 of 150 nm thickness is formed on the gate insulating film 3 by an ion etching method from a polycrystalline silicon film deposited by a CVD method (FIG. 1B). Next, a drain region 6 and a source region 16 are formed by using the gate electrode 5 as a mask through an arsenic ion implantation with an acceleration energy of 60 KeV and in a dosage of $5 \times 10^{15}$ $cm^{-2}$ (FIG. 1C). After an inter-ply insulating film 7 of 200 nm thickness is deposited, an activation lamp annealing, that is, RTA (Rapid Thermal Anneal) is conducted at 1000° C. for 10 seconds. Then, contact holes 9, 19 and 29 are formed in the inter-ply insulating film 7, and aluminum wiring electrodes 8, 18 and 28 are formed to contact in ohmic to the drain region 6, the source region 16 and the gate electrode 5 through the contact holes 9, 19 and 29, respectively. Next, a passivation film 11 of 1.0 μm thickness is entirely formed (FIG. 1D).

Figure 2:
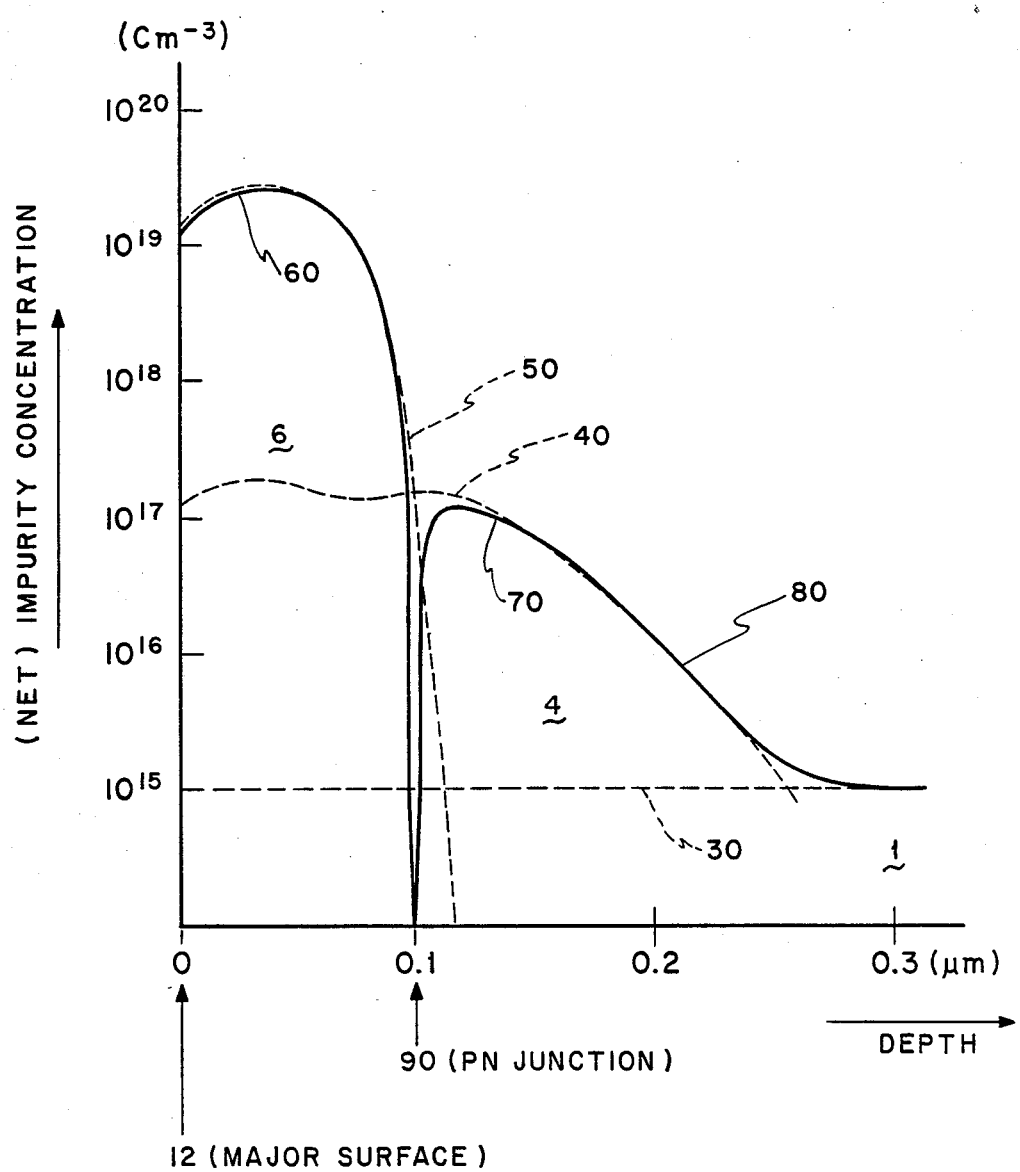
FIG. 2 is a diagram showing a net impurity concentration distributed in the depthwise at the drain region and thereunder in FIG. 1D of the prior art.

Referring to FIG. 2, the impurity concentration distributions in the depthwise direction after the RTA treatment are shown. A broken line 30 represents the uniform impurity (boron) concentration of the P-type silicon substrate 1, and a broken line 40 represents the impurity (boron) concentration by the boron ion implantation processes by 35 KeV and 10 KeV energy, respectively. A broken line 50 represents the impurity (arsenic) concentration by the arsenic ion implantation process. The profile of the N+-type drain region 6 (also of the N+-type source region 16) is based on a net impurity concentration of N-type represented by a solid line 60. The N-type net impurity concentration 60 is obtained and calculated by subtracting the sum of the P-type impurity concentration 40 and the P-type impurity concentration 30 from the N-type impurity concentration 50 in every part. On the other hand, the profile of the P+-type impurity region 4 is based on a net impurity concentration of P-type represented by a broken line 70. The P-type net impurity concentration 70 of the P+-type impurity region 4 is obtained and calculated by adding the P-type impurity concentration 40 to the P-type impurity concentration 30 in every part, and only in the vicinity of the N+-type drain region 6, the end profile of the N-type impurity concentration 50 further subtracts from the sum of the P-type impurity concentrations 40, 30. The PN junction 90 which define the bottom of the drain region 6 is formed by the N-type net impurity concentration 60 and the P-type net impurity concentration 70. It is to be noted that the P-type profile 70 has a gentle slope 80 due to an essential nature of ion implantation method because the slope is shaped only by the P-type ion implantation profile 40. Therefore, the P+-type impurity region 4 is deeply formed inevitably. Consequently, in the prior art, the depletion layer from the bottom PN junction 90 of the drain region 6 cannot be largely extended, and therefore, a high speed of the IGFET in the operation is difficult due to a large drain PN junction capacitance at the bottom thereof.

Description of the Embodiments

The profile of the P+-type impurity region at the portion must be of an abrupt shape in order to form the P+-type impurity region under the bottom of the drain region in a narrow width in the depthwise direction. According to the present invention, the abrupt shape can be formed by P-type impurities and N-type impurities to compensate the P-type impurities.

Figure 3:
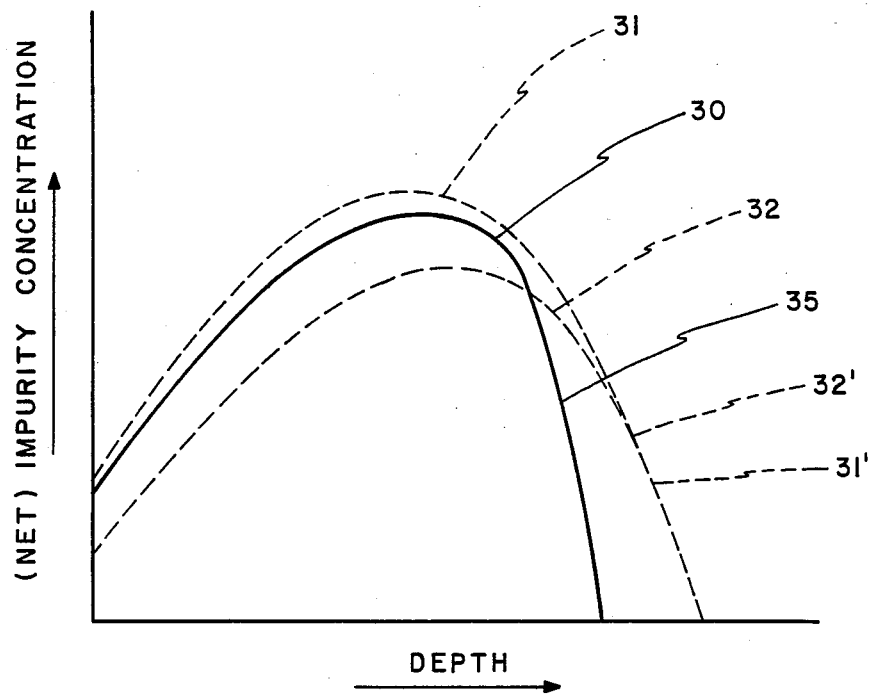
FIG. 3 is a diagram showing a principle of the present invention.

FIG. 3 shows the principle of the present invention. P-type atoms such as boron and N-type atoms such as phosphorus are injected in a same portion of a silicon substrate from the major surface by ion-implantation with different energy and different dosage density, each other and the RTA treatment is conducted. The obtained P-type impurity, that is, boron concentration distribution is represented by a broken line 31, and the obtained N-type impurity, that is, phosphorus concentration distribution is represented by a broken line 32. In every part, the P-type impurity is compensated by the N-type impurity, and a net impurity concentration profile of P-type obtained by the compensation is represented by a solid line 30. The N-type impurity concentration distribution 32 has the peak somewhat deeper than that of the P-type impurity concentration distribution 31, and the dosage in the N-type distribution 32 is somewhat smaller than that of the P-type distribution 31. Favorably, the both end profiles 31' and 32' of the P-type and N-type impurity concentration distributions 31 and 32 are overlapped each other. In this case, the net impurity concentration distribution 30 of P-type has an abrupt profile 35 at the boundary part by compensating the P-type impurities with the N-type impurities, and it can be calculated by subtracting the N-type impurity concentration of profile 32 from the P-type impurity concentration of profile 31 in every part. The technology is employed in the present invention to form the P-type region surrounding the N-type drain region.

Figure 4A:
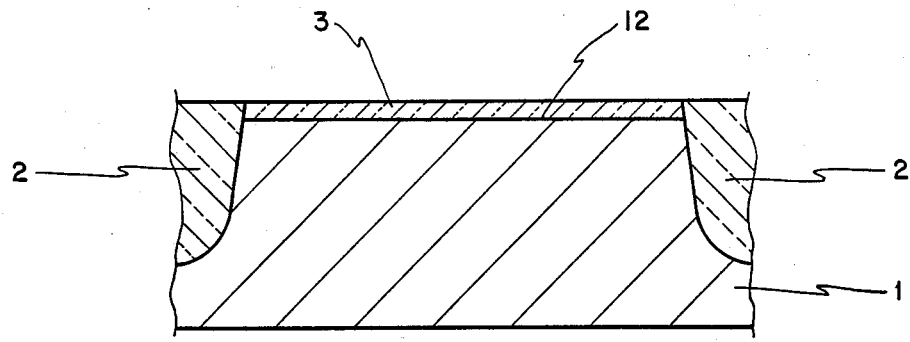
FIGS. 4A to 4C are cross-sectional views showing process steps in sequence for manufacturing a first embodiment of the present invention.
Figure 4B:
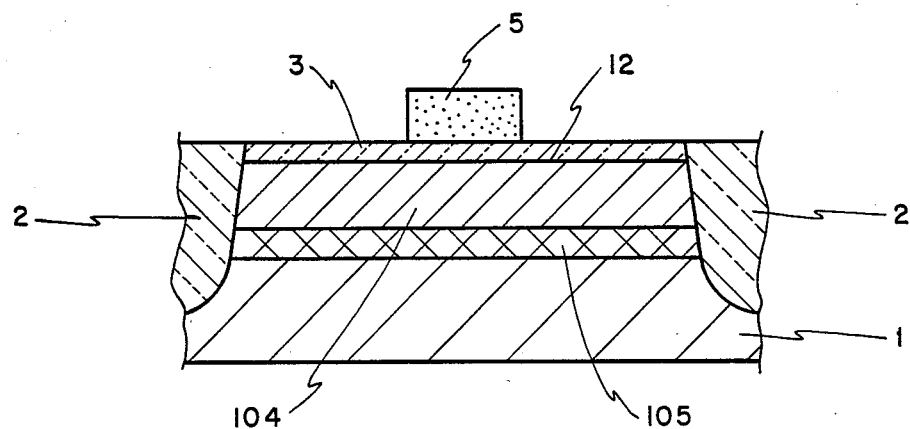
Figure 4C:
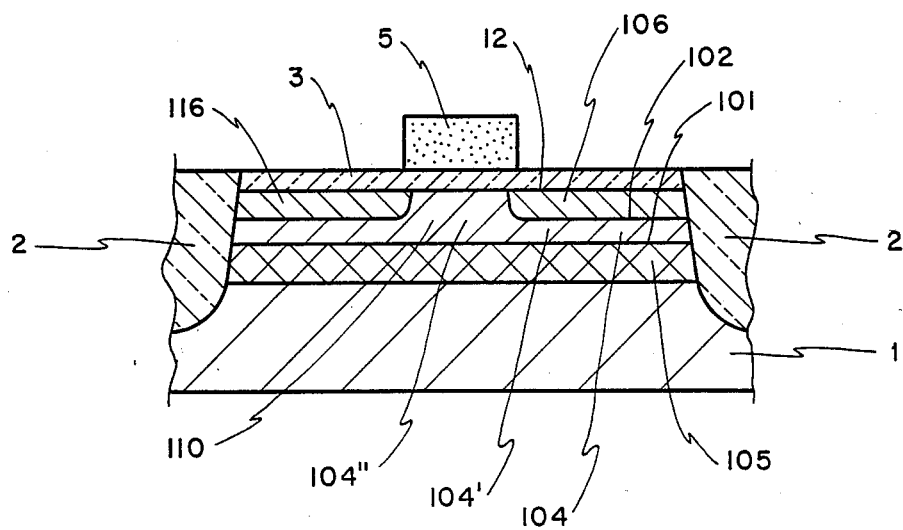
Figure 5A:
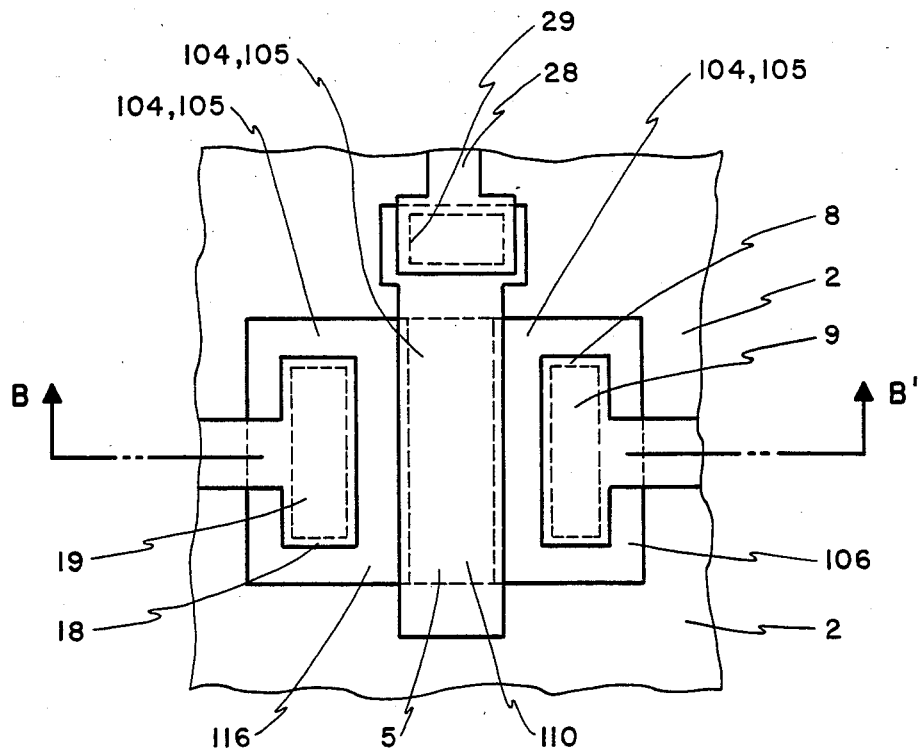
FIG. 5A is a plan view showing the first embodiment of the present invention.
Figure 5B:
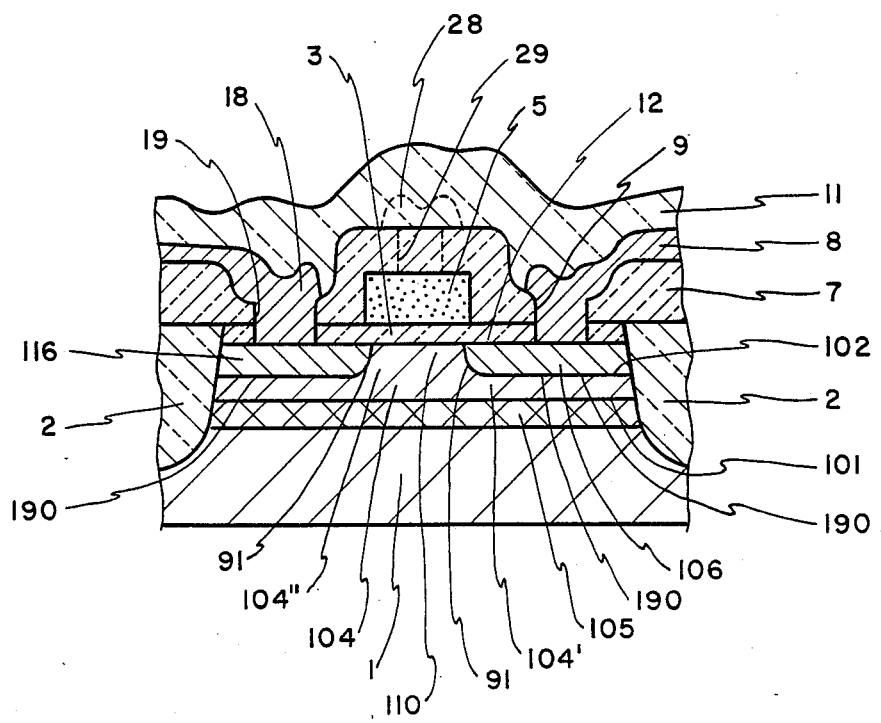
FIG. 5B is a cross-sectional view taken along line B–B' in FIG. 5A as viewed in the direction of arrows.

Referring to FIGS. 4 and 5, an IGFET of a first embodiment and a process for manufacturing the same will be explained. In FIGS. 4 and 5, the same component as those in FIG. 1 are indicated by the same reference numerals. The step shown in FIG. 4A is the same as in FIG. 1A. Next, boron ions are injected into the substrate through the film 3 with an accelerating energy of 35 KeV in a dosage of $3 \times 10^{12}$ cm$^{-2}$. Then, phosphorus ions are injected into the substrate through the film 3 with an accelerating energy of 120 KeV in a dosage of $8 \times 10^{11}$ cm$^{-2}$. Further, in order to control the threshold voltage of the IGFET, the surface portion of the transistor forming region is subjected to a boron implantation through the film 3 with an acceleration energy of 10 KeV and in a dosage of $1 \times 10^{12}$ cm$^{-2}$. The boron atoms by the ion-implantation processes of 35 KeV energy and 10 KeV energy constitute a first impurity region 104 of P+-type, and by adding further the phosphorus atoms by the ion-implantation process of 120 KeV energy, a second impurity region 105 of P-type having low net impurity concentration is formed. Next, a gate electrode 5 of 150 nm thickness is formed on the gate insulating film 3 of 8 nm thickness by an ion etching method from a polycrystalline silicon film deposited by a CVD method (FIG. 4B). Next, an N+-type drain region 106 and an N+-type source region 116 are formed by using the gate electrode 5 as a mask through arsenic ion implantation with an acceleration energy of 60 KeV and in a dosage of $5 \times 10^{15}$ cm$^{-2}$ (FIG. 4C). After an inter-ply insulating film 7 of 200 nm thickness is deposited, an activation lamp annealing, that is, RTA (Rapid Thermal Anneal) is conducted at 1000° C. for 10 seconds. Then, contact holes 9, 19, and 29 are formed in the inter-ply insulating film 7, and aluminum wiring electrodes 8, 18 and 28 are formed to contact in ohmic to the drain region 106, the source region 116 and the gate electrode 5 through the contact holes 9, 19 and 29, respectively. Next, a passivation film 11 of 1.0 μm thickness is entirely formed (FIGS. 5A and 5B). As shown in FIG. 5B, the N+-type drain region 106 (also the N+-type source region 116) is surrounded by the P+-type first impurity region 104 having high impurity concentration. Namely, the whole bottom 190 of the drain region is contacted to a first portion 104' of the first impurity region 104, and a side 91 of the drain region facing to the source region is contacted to a second portion 104'' of the first impurity region 104 in full depth from the major surface 12 of the channel region 110 to the edge of the bottom 190.

Figure 7:
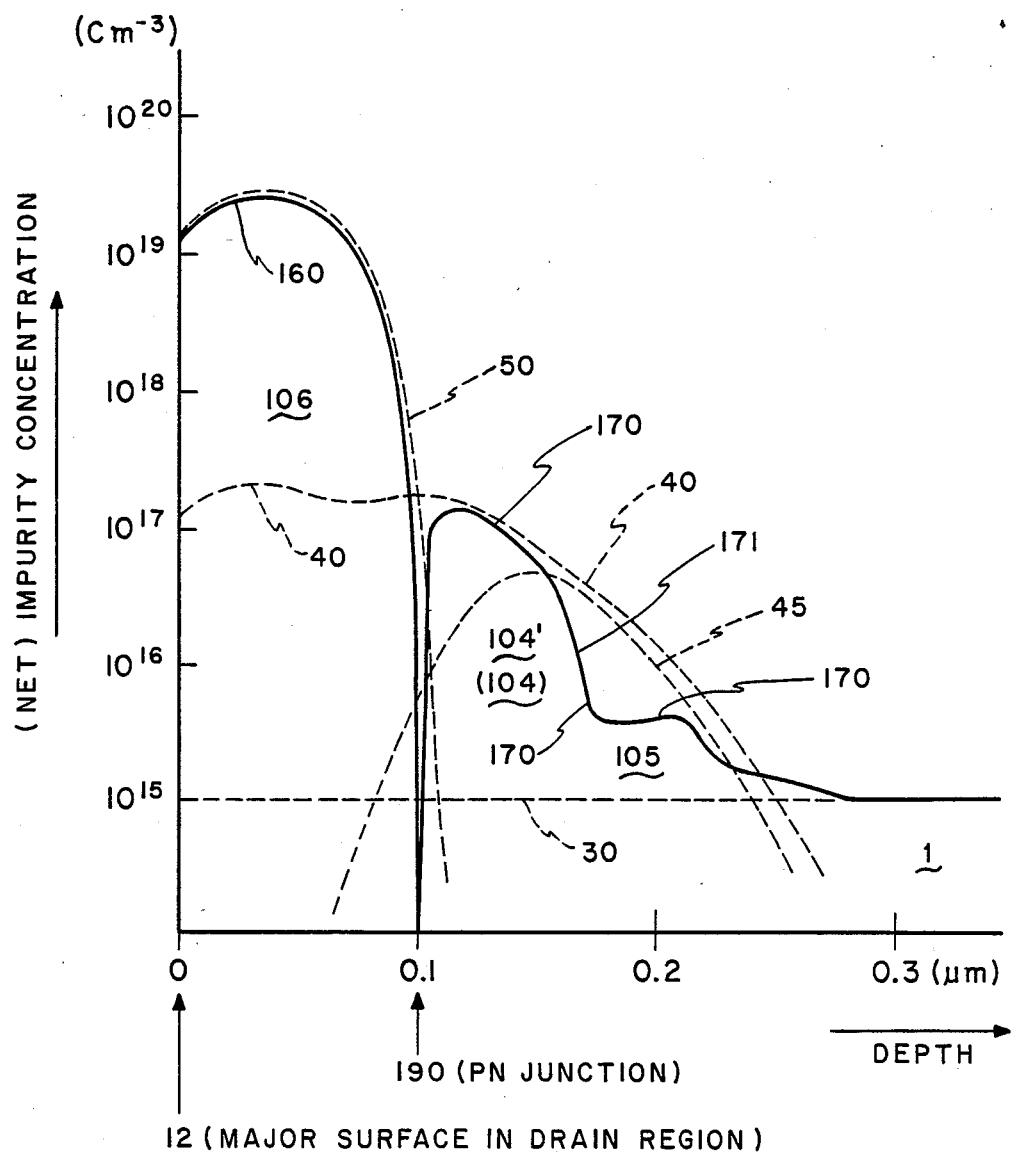
FIG. 7 is a diagram showing net impurity concentrations with respective impurity concentrations distributed in the depthwise direction at the drain region and thereunder according to the first embodiment of the present invention.

After the necessary process steps including the RTA process step, respective impurities are distributed in the depthwise direction as shown in FIG. 7.

Figure 6:
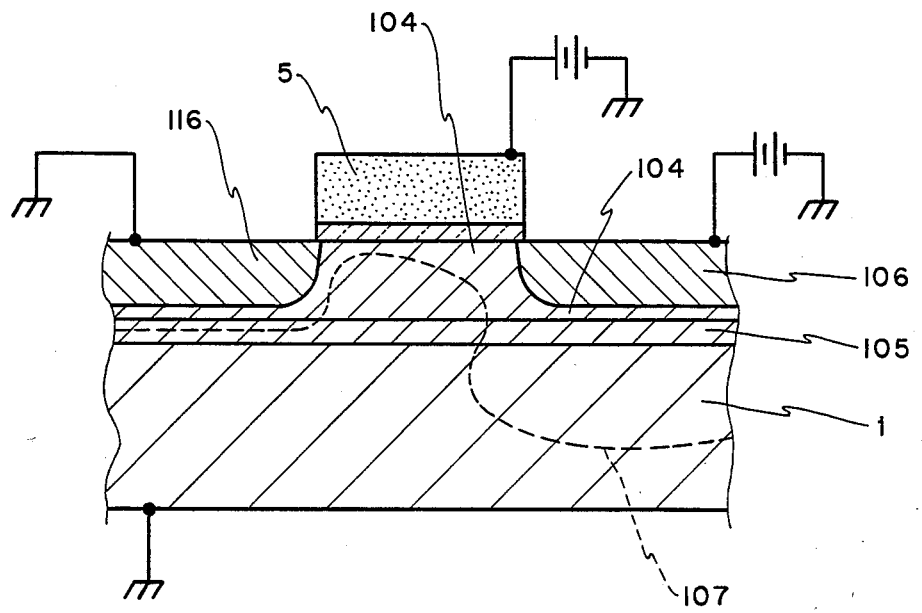
FIG. 6 is a cross-sectional view showing schematically a depletion layer of the first embodiment in the operation state.
Figure 8:
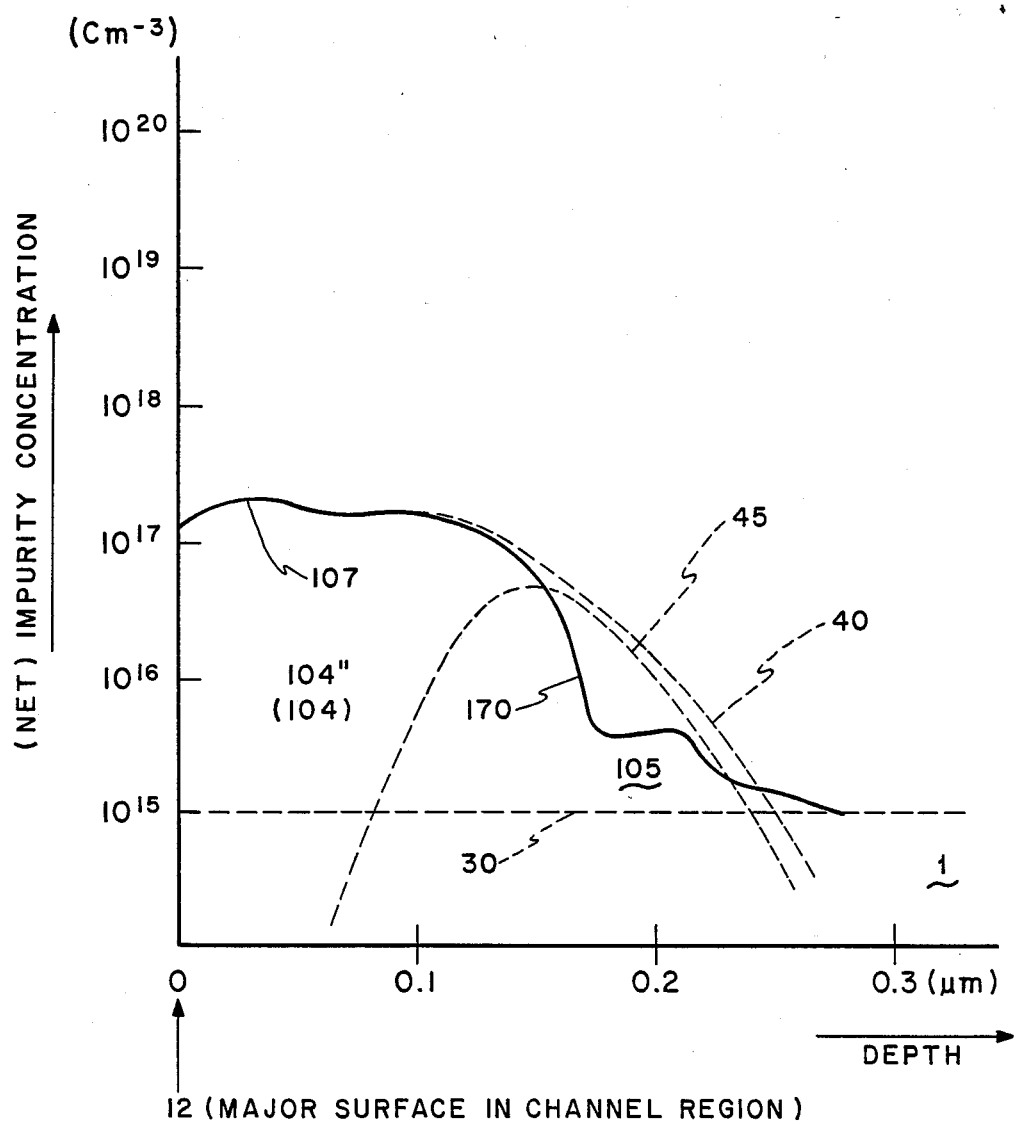
FIG. 8 is a diagram showing net impurity concentrations with respective impurity concentrations distributed in the depthwise direction at the channel region and thereunder according to the first embodiment of the present invention.

Reffering to FIG. 7, a broken line 30 represents the uniform impurity (boton) concentration in the silicon substrate 1 of P-type, and a broken line 40 represents the impurity (boron) concentration by the boron ion implantation processes of 35 KeV and 10 KeV energy. A broken line 50 represents the impurity (arsenic) concentration by the arsenic ion implantation of 60 KeV energy, and a broken line 45 represents the impurity (phosphorus) concentration of the present invention by the phosphorus ion implantation of 120 KeV energy. The profile of the N-type drain region 106 (also of the N-type source region 116) is based on a net impurity concentration of N-type represented by a solid line 160. The N-type net impurity concentration profile 160 having the maximum value of more than $10^{19}$ cm$^{-3}$ is formed by compensating the N-type impurity with the P-type impurity and be calculated by subtracting the P-type impurity concentrations 40, 30 from the N-type impurity concentration 50 in every part. On the other hand, the profile of the first impurity region 104 of P+-type (in FIG. 7, the first portion 104' of the first impurity region 104 under the drain region is shown) and the second impurity region 105 of P-type are based on a net impurity concentration represented by a solid line 170. The P+- and P-type net impurity concentration is formed by compensating the P-type impurity with the N-type impurity and be calculated by subtracting the N-type impurity (phosphorus) concentration 45 from the sum of the P-type impurity (boron) concentration 40 and the P-type impurity (boron) concentration 30 in every part, and only in the vicinity of the N+-type drain region 106, the end profile of the N-type impurity (arsenic) concentration 50 further subtracts to form the net impurity concentration profile 170 in this part. The first impurity region 104 has the maximum net impurity concentration value of $10^{17}$ cm$^{-3}$ or more, and the net impurity concentration value in the second impurity region 105 is less than $10^{16}$ cm$^{-3}$. The PN junction 190 which define the bottom of the drain region 106 is formed by the N-type net impurity concentration profile 160 and the P-type net impurity concentration profile 170. In the embodiment, the first impurity region 104 (104') of P+-type has an abrupt boundary shape 171 by existing the N-type impurity (phosphorus) concentration 45 thereby forming the first impurity region 104' under the bottom of the drain region in narrow width of about 0.08 μm. Therefore, the portion 104' of the P+-type impurity region 104 can be completely depleted by a depletion layer from the PN junction 190 by the built-in potent in a zero bias state. In this case, when a positive drain voltage (bias) is applied to the drain region in the operation, the depletion layer is promptly extended, through the second impurity region of low impurity concentration of less than $10^{16}$ cm$^{-3}$, to the substrate of $10^{15}$ cm$^{-3}$ impurity concentration under the drain region. Consequently, a high speed IGFET in the operation is obtained with a small output capacitance. FIG. 8 shows impurity concentrations at the channel region 101 and thereunder of the first embodiment. In FIG. 8, the same components as those in FIG. 7 are represented the same reference numerals. The second portion 104" of the P+-type impurity region 104 at and under the channel region 101 is attached to the sides 91 (FIG. 5B) of source and drain regions facing each other from the major surface 12 to the edge of the bottom 190 thereof entirely. FIG. 6 shows the depletion layer 107 from the drain region 106 of the first embodiment which extends predominately downward in an inner section of the silicon substrate 1 under the drain region in the operation state by applying positive voltage to the drain region and to the gate electrode while the source region and the substrate are connected to a ground line.

Figure 9:
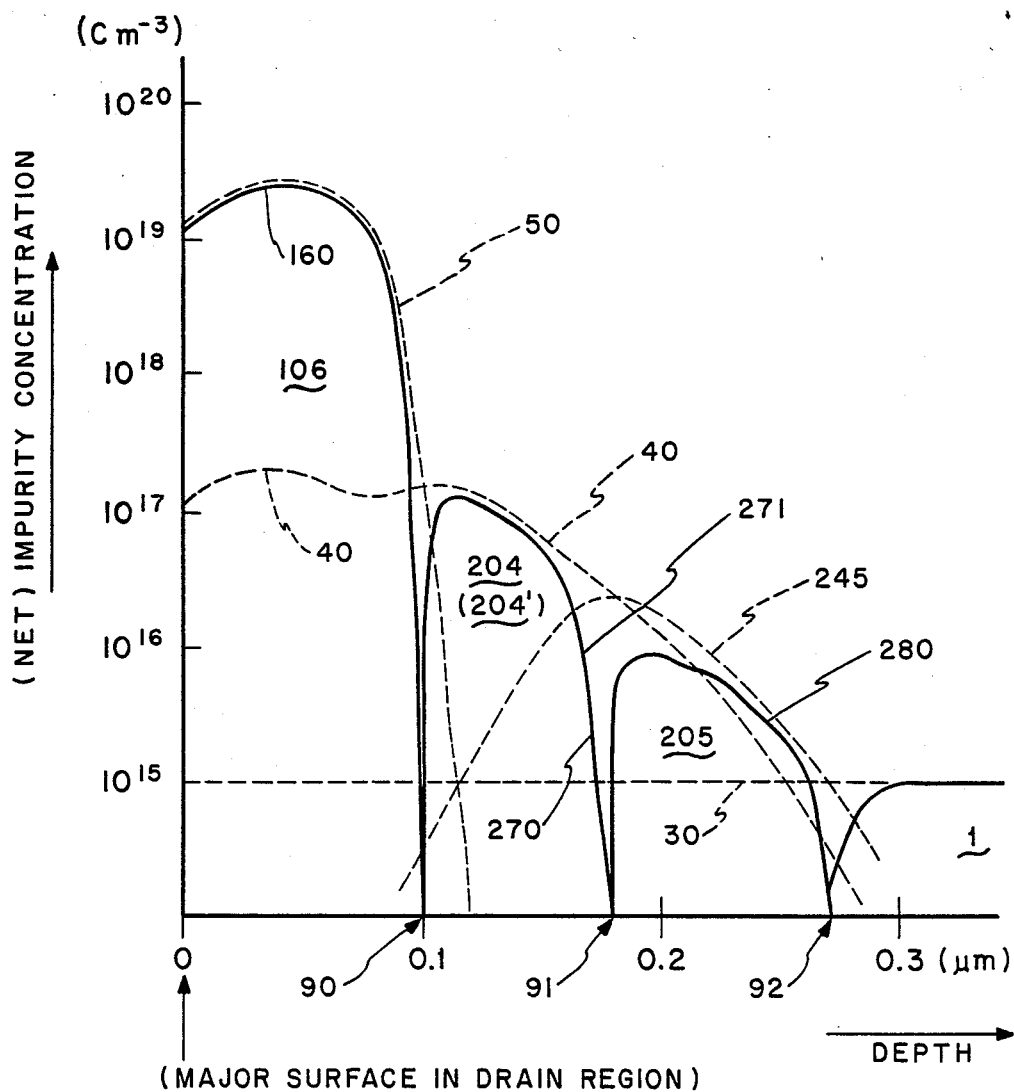
FIG. 9 is a diagram showing net impurity concentrations with respective impurity concentrations distributed in the depthwise direction at a drain region and thereunder according to a second embodiment of the present invention.

In a second embodiment of the present invention, the phosphorus ion implantation is conducted by 140 KeV energy and $7 \times 10^{11}$ cm$^{-2}$ dosage. The energy is higher and the dosage is smaller than the first embodiment. Therefore, the second impurity region under the P+-type first impurity type becomes N$^-$-type. In this case, the second impurity region as well as the first impurity region is filled with the depletion layer when a voltage is not applied to the drain region (zero bias state). Therefore, the capacitance is further small. On the other hand, the depletion layer in the N$^-$-type second impurity region extends to the under the source region and reaches to the bottom of the source region. However, the N$^-$-type second impurity region has a narrow width inherently in the depthwise direction and be sandwiched by the P+-type first impurity region and the P-type substrate from upper and under sides. Therefore, the built-in potential thereof is enhanced thereby causing no punch-through phenomenon between source and drain regions. The other parts of the second embodiment are the same as the first embodiment shown in FIGS. 4 and 5. Referring to FIG. 9, the impurity concentrations including the net impurity concentrations of the second embodiment will be explained. In FIG. 9, the same components as those in FIG. 7 are represented by the same reference numerals. A broken line 245 represents the impurity (phosphorus) concentration by the phosphorus ion implantation by 140 KeV which profile is deeper and higher at the deep part than the profile 40 of the boron concentration.

Therefore, the second impurity region 205 defined by a net impurity concentration profile 280, which is obtained by subtracting the sum of the P-type impurity concentration 40 and the P-type uniform impurity concentration 30 from the N-type impurity concentration 245 in every part, becomes N-type, and two of PN junctions 91 and 92 are formed between a P+-type first impurity region 204 and the N-type second impurity region 205 and between the N-type second impurity region 205 and the P-type silicon substrate 1, respectively. The first impurity region 204 (a first portion 204' thereof under the drain region 106) is defined by a net impurity concentration 270 of P-type which is obtained by the same manner as the net impurity concentration 170 in FIG. 7 of the first embodiment. The net impurity concentration profile 270 of the first impurity region 204 of P+-type has also an abrupt shape 271 at the boundary to realize a narrow width of the first impurity region in the depthwise direction.

The first and second embodiments concern N-channel type IGFET's. However, as a matter of course, the present invention also can be adaptable in P-channel type IGFET's.

What is claimed is:

1. An insulated gate field effect transistor comprising:
   a semiconductor substrate of a first conductivity type having a major surface and an impurity concentration;
   a first impurity region of said first conductivity type having a first net impurity concentration obtained, in every part, by compensating first impurity atoms of said first conductivity type involved in said first impurity region with second impurity atoms of a second conductivity type opposite to said first conductivity type, involved in said first impurity region, a maximum value of said first net impurity concentration being higher than said impurity concentration of said substrate, and said first impurity region defined by said first net impurity concentration having an upper surface coinciding with said major surface and a bottom positioned at a first depth from said major surface;
   a second impurity region having a second net impurity concentration obtained, in every part, by compensating each other between first impurity atoms of said first conductivity type involved in said second impurity region and second impurity atoms of said second conductivity type involved in said second impurity region, a maximum value of said second net impurity concentration being lower than said maximum value of said first net impurity concentration of said first impurity region, said second impurity region defined by said second net impurity concentration being formed in an inner section of said substrate abutted against said bottom of said first impurity region at said first depth, and said second impurity region by said second net impurity concentration being said second conductivity type so that PN junctions are formed at said first depth by said first and second impurity regions and at a boundary of said second impurity region and said substrate, respectively;
   a channel region positioned in said major surface and composed of a surface portion of said first impurity region;
   a gate insulating film formed on said channel region;
   a gate electrode formed on said gate insulating film; and
   source and drain regions of said second conductivity type formed in said substrate and separated each other by interposing said channel region therebetween, at least said drain region having a third net impurity concentration obtained, in every part, by compensating second impurity atoms of said second conductivity type involved in said drain region with first impurity atoms of said first conductivity type involved in said drain region, a maximum value of said third net impurity concentration of said drain region being higher than said maximum value of said first net impurity concentration of said first impurity region, and said drain region defined by said third net impurity concentration having an upper surface coinciding with said major surface, a bottom contacted to a first portion of said first impurity region at a second depth from said major surface shallower than said first depth and side facing to said source region, said side being extended from said major surface to an edge of said bottom and contacted in full depth to a second portion of said first impurity region including said surface portion thereof;

whereby said first portion of said first impurity region under said bottom of said drain region is sufficiently narrow between said first and second depths such that said first portion is completely filled with a depletion layer extending from a PN junction between said bottom of said drain region and said first portion contacted to said bottom when said transistor including said drain region is in a substantially zero bias state.

2. An insulated gate field effect transistor of claim 1, in which said maximum value of said third net impurity concentration is $10^{19}$ cm$^{-3}$ or more; said maximum value of said first net impurity concentration is $10^{17}$ cm$^{-3}$ or more; and said maximum value of said second net impurity concentration is $10^{16}$ cm$^{-3}$ or less.

3. An insulated gate field effect transistor of claim 1, in which a distance from a PN junction between said drain region and said first impurity region to said PN junction between said first and second impurity regions is 0.1 μm or less.

* * * * *